(12) United States Patent
Pal et al.

(10) Patent No.: US 9,947,559 B2
(45) Date of Patent: Apr. 17, 2018

(54) THERMAL MANAGEMENT OF EDGE RING IN SEMICONDUCTOR PROCESSING

(71) Applicant: APPLIED MATERIALS, INC., Santa Clara, CA (US)

(72) Inventors: Aniruddha Pal, Santa Clara, CA (US); Martin Jeffrey Salinas, San Jose, CA (US); Dmitry Lubomirsky, Cupertino, CA (US); Imad Yousif, San Jose, CA (US); Andrew Nguyen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 852 days.

(21) Appl. No.: 13/646,069

(22) Filed: Oct. 5, 2012

(65) Prior Publication Data

US 2013/0105088 A1 May 2, 2013

Related U.S. Application Data

(60) Provisional application No. 61/552,749, filed on Oct. 28, 2011.

(51) Int. Cl.
| | | |
|---|---|---|
| C23C 16/00 | (2006.01) |
| C23C 16/50 | (2006.01) |
| C23F 1/00 | (2006.01) |
| H01L 21/306 | (2006.01) |
| H01L 21/67 | (2006.01) |
| C23C 16/458 | (2006.01) |

(52) U.S. Cl.
CPC .... *H01L 21/67103* (2013.01); *C23C 16/4585* (2013.01)

(58) Field of Classification Search
USPC ............... 118/724–732; 156/345.51–345.55
See application file for complete search history.

(56) References Cited

U.S. PATENT DOCUMENTS

| | | |
|---|---|---|
| 7,244,336 B2 | 7/2007 | Fischer et al. |
| 8,988,848 B2 | 3/2015 | Todorow et al. |

(Continued)

FOREIGN PATENT DOCUMENTS

| | | |
|---|---|---|
| JP | 2004-088063 | 3/2004 |
| JP | 2007-258500 | 10/2007 |

(Continued)

OTHER PUBLICATIONS

International Search Report and Written Opinion dated Mar. 19, 2012 for PCT Application No. PCT/US2012/060313.

(Continued)

*Primary Examiner* — Karla A Moore
*Assistant Examiner* — Tiffany Z Nuckols
(74) *Attorney, Agent, or Firm* — Moser Taboada; Alan Taboada

(57) ABSTRACT

Apparatus for processing semiconductors are provided herein. In some embodiments, an apparatus for processing a substrate may include: a first ring disposed concentrically about a substrate support, the first ring configured to position a substrate atop the substrate support during processing; and a second ring disposed between the substrate support and the first ring, the second ring configured to provide a heat transfer path from the first ring to the substrate support.

18 Claims, 3 Drawing Sheets

(56) References Cited

U.S. PATENT DOCUMENTS

| | | | |
|---|---|---|---|
| 2004/0261946 A1* | 12/2004 | Endoh et al. | 156/345.15 |
| 2005/0133165 A1* | 6/2005 | Liu | C23C 16/4401 |
| | | | 156/345.51 |
| 2005/0274321 A1* | 12/2005 | Ukei et al. | 118/715 |
| 2008/0149598 A1* | 6/2008 | Hayashi | H01J 37/32522 |
| | | | 216/67 |
| 2010/0040768 A1* | 2/2010 | Dhindsa | H01J 37/32724 |
| | | | 427/8 |
| 2010/0243606 A1 | 9/2010 | Koshimizu et al. | |
| 2010/0326600 A1* | 12/2010 | Park | H01J 37/32091 |
| | | | 156/345.37 |
| 2010/0326957 A1* | 12/2010 | Maeda et al. | 216/67 |
| 2011/0240598 A1 | 10/2011 | Okayama et al. | |
| 2011/0300714 A1* | 12/2011 | Stevenson | H01L 21/67069 |
| | | | 438/710 |
| 2013/0105088 A1 | 5/2013 | Pal et al. | |
| 2013/0154175 A1 | 6/2013 | Todorow et al. | |

FOREIGN PATENT DOCUMENTS

| | | |
|---|---|---|
| JP | 2009-283700 | 12/2009 |
| KR | 10-2007-0018404 A | 2/2007 |
| WO | WO 03/043061 A1 | 5/2003 |

OTHER PUBLICATIONS

Search Report for Taiwan Invention Patent Application No. 101138100 dated Aug. 3, 2017.

* cited by examiner

THERMAL MANAGEMENT OF EDGE RING IN SEMICONDUCTOR PROCESSING

CROSS-REFERENCE TO RELATED APPLICATIONS

This application claims benefit of U.S. provisional patent application Ser. No. 61/552,749, filed Oct. 28, 2011, which is herein incorporated by reference.

FIELD

Embodiments of the present invention generally relate to a semiconductor processing.

BACKGROUND

Conventional semiconductor process chambers, for example, such as etch chambers, typically utilize a substrate support having one or more rings (e.g. an edge ring) disposed atop the substrate support and configured to secure the substrate in a desired position during processing. However, the inventors have observed that conventionally used edge rings may comprise different thermal properties (e.g. different heating and cooling rates) compared to the substrate support, thereby causing temperature non-uniformities proximate the edge of the substrate, thus causing an undesirable non-uniform processing of the substrate. In addition, the edge ring may be heated to a higher temperature than the substrate support during processing due to heat generated by the process or by processing components, for example, such as an upper electrode (e.g., showerhead or ceiling), thereby leading to further temperature non-uniformities.

Thus, the inventors have provided an improved apparatus for processing a substrate.

SUMMARY

Apparatus for processing semiconductors are provided herein. In some embodiments, an apparatus for processing a substrate may include: a first ring disposed concentrically about a substrate support, the first ring configured to position a substrate atop the substrate support during processing; and a second ring disposed between the substrate support and the first ring, the second ring configured to provide a heat transfer path from the first ring to the substrate support.

In some embodiments, a process chamber may include a chamber body defining an inner volume; and a substrate support disposed within the inner volume, the substrate support having a first ring disposed concentrically about a substrate support, the first ring configured to position a substrate atop the substrate support during processing and a second ring disposed between the substrate support and the first ring, the second ring configured to provide a heat transfer path from the first ring to the substrate support.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
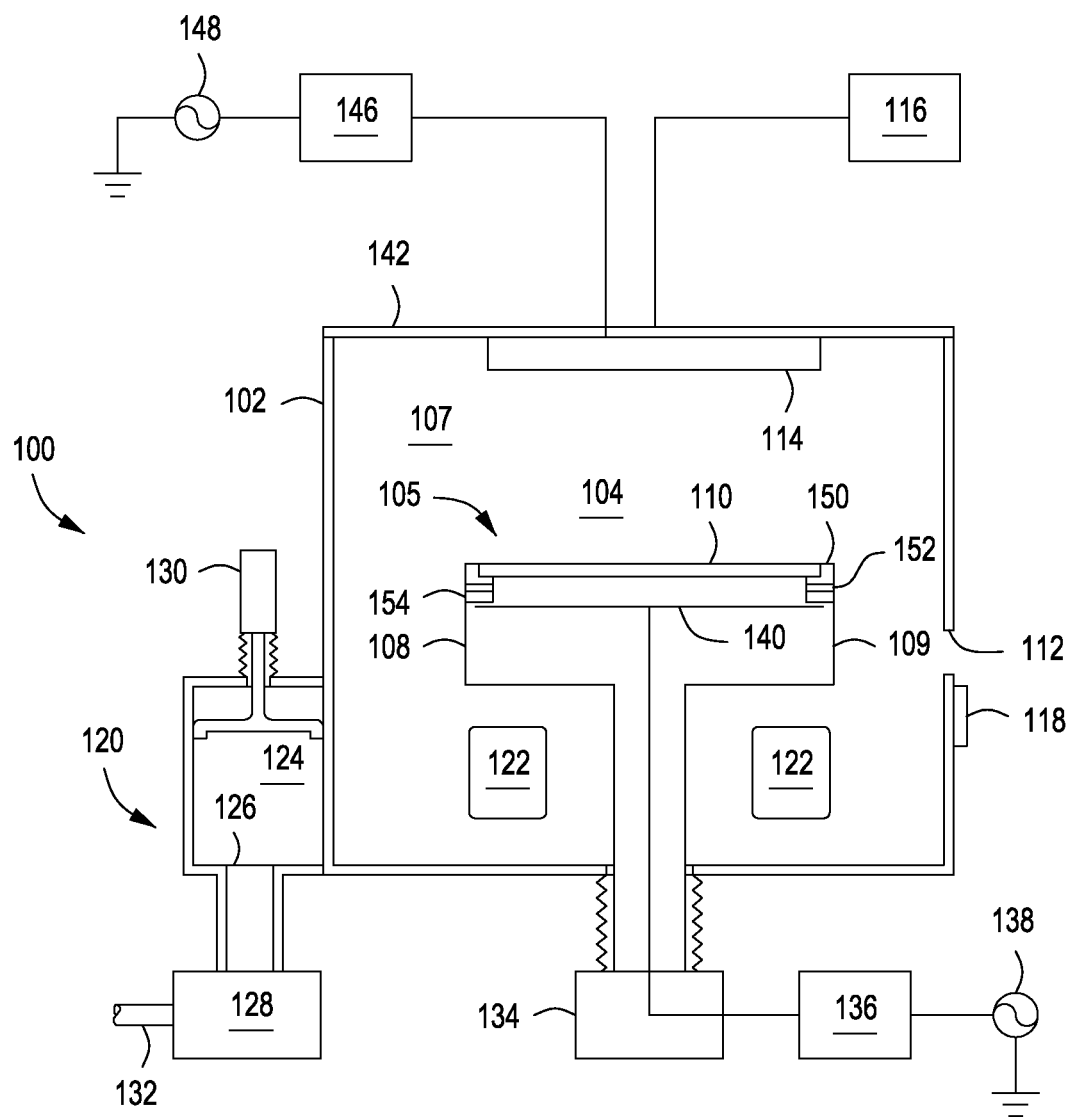
FIG. 1 depicts a process chamber suitable for use with an apparatus for processing a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for processing substrates are provided herein. Embodiments of the present invention may advantageously provide a discrete, drop-in replacement part for a semiconductor processing chamber that facilitates enhanced temperature control of an edge ring disposed in the processing chamber, thereby providing more uniform heating and cooling of a substrate during processing.

FIG. 1 depicts process chamber suitable for use with an apparatus for processing a substrate in accordance with some embodiments of the present invention. The process chamber 100 may generally comprise chamber body 102 having an apparatus 105 for processing a substrate 110 disposed therein. Exemplary process chambers may include the DPS®, ENABLER®, SIGMA™, ADVANTEDGE™, or other process chambers, available from Applied Materials, Inc. of Santa Clara, Calif. Other process chambers may be suitably modified in accordance with the teachings provided herein, including those available from other manufacturers.

The chamber body 102 has an inner volume 107 that may include a processing volume 104 and an exhaust volume 106. The processing volume 104 may be defined, for example, between a substrate support 108 disposed within the chamber body 102 for supporting a substrate 110 thereupon during processing and one or more gas inlets, such as a showerhead 114 and/or nozzles provided at desired locations.

One or more gas inlets (e.g., the showerhead 114) may be coupled to a gas supply 116 for providing one or more process gases into the processing volume 104 of the chamber body 102. Although a showerhead 114 is shown in FIG. 1, additional or alternative gas inlets may be provided, such as nozzles or inlets disposed in the ceiling 142 or on the sidewalls of the chamber body 102 or at other locations suitable for providing gases as desired to the process chamber 100, such as the base of the process chamber, the periphery of the substrate support, or the like.

One or more plasma power sources (one RF power source 148 shown) may be coupled to the process chamber 100 to supply RF power to the showerhead 114, via one or more respective match networks (one match network 146 shown). In some embodiments, the process chamber 100 may utilize inductively coupled RF power for processing. For example, the process chamber 102 may have a ceiling 142, made from a dielectric material and a dielectric showerhead 114. The ceiling 142, may be substantially flat, although other types of ceilings, such as dome-shaped ceilings or the like, may also be utilized. In some embodiments, an antenna comprising at least one inductive coil element (not shown) may be disposed above the ceiling 142. In such embodiments, the inductive coil elements may be coupled to one or more RF power sources (e.g., the RF power source 148) through one or more respective matching networks (e.g., matching network 146). The one or more plasma sources may be capable of producing up to 5000 W at a frequency of about 2 MHz and/or about 13.56 MHz, or higher frequency, such as 27 MHz and/or 60 MHz. In some embodiments, two RF power sources may be coupled to the inductive coil elements through respective matching networks for providing RF power at frequencies of about 2 MHz and about 13.56 MHz.

The exhaust volume 106 may be defined, for example, between the substrate support 108 and a bottom of the chamber body 102. The exhaust volume 106 may be fluidly coupled to the exhaust system 120, or may be considered a part of the exhaust system 120. The exhaust system 120 generally includes a pumping plenum 124 and one or more conduits that couple the pumping plenum 124 to the inner volume 107 (and generally, the processing volume 104) of the process chamber 102.

Each conduit has an inlet 122 coupled to the inner volume 107 (or, in some embodiments, the exhaust volume 106) and an outlet (not shown) fluidly coupled to the pumping plenum 124. For example, each conduit may have an inlet 122 disposed in a lower region of a sidewall or a floor of the process chamber 102. In some embodiments, the inlets are substantially equidistantly spaced from each other.

A vacuum pump 128 may be coupled to the pumping plenum 124 via a pumping port 126 for pumping out the exhaust gases from the process chamber 102. The vacuum pump 128 may be fluidly coupled to an exhaust outlet 132 for routing the exhaust as required to appropriate exhaust handling equipment. A valve 130 (such as a gate valve, or the like) may be disposed in the pumping plenum 124 to facilitate control of the flow rate of the exhaust gases in combination with the operation of the vacuum pump 128. Although a z-motion gate valve is shown, any suitable, process compatible valve for controlling the flow of the exhaust may be utilized.

The substrate 110 may enter the process chamber 102 via an opening 112 in a wall of the process chamber 102. The opening 112 may be selectively sealed via a slit valve 118, or other mechanism for selectively providing access to the interior of the chamber through the opening 112. The substrate support 108 may be coupled to a lift mechanism 134 that may control the position of the substrate support 108 between a lower position (as shown) suitable for transferring substrates into and out of the chamber via the opening 112 and a selectable upper position suitable for processing. The process position may be selected to maximize process uniformity for a particular process step. When in at least one of the elevated processing positions, the substrate support 108 may be disposed above the opening 112 to provide a symmetrical processing region.

In some embodiments, the substrate support 108 may include a mechanism that retains or supports the substrate 110 on the surface of the substrate support 108, such as an electrostatic chuck 109. In some embodiments, the substrate support 108 may include mechanisms for controlling the substrate temperature and/or for controlling the species flux and/or ion energy proximate the substrate surface.

For example, in some embodiments, the substrate support 108 may include an RF bias electrode 140. The RF bias electrode 140 may be coupled to one or more bias power sources (one bias power source 138 shown) through one or more respective matching networks (matching network 136 shown). The one or more bias power sources may be capable of producing up to 12000 W at a frequency of about 2 MHz, or about 13.56 MHz, or about 60 MHz. In some embodiments, two bias power sources may be provided for coupling RF power through respective matching networks to the RF bias electrode 140 at a frequency of about 2 MHz and about 13.56 MHz. In some embodiments, three bias power sources may be provided for coupling RF power through respective matching networks to the RF bias electrode 140 at a frequency of about 2 MHz, about 13.56 MHz, and about 60 MHz. The at least one bias power source may provide either continuous or pulsed power. In some embodiments, the bias power source may be a DC or pulsed DC source.

In some embodiments, the substrate support 108 may include additional components configured to secure the substrate 110 in a position for processing. For example, in some embodiments, an edge ring (first ring 150) may be disposed concentrically about the substrate support 108 and configured to position the substrate atop the substrate support 108. The first ring 150 may be made from any insulating material suitable for semiconductor processing, for example, such as quartz. When present, the first ring 150 protects the surfaces of the substrate support 108 from plasma induced damage during processing and facilitates a concentration of plasma towards the substrate 110.

The inventors have observed that in process chambers utilizing conventional edge rings, the edge ring may have different thermal properties (e.g. different heating and cooling rates) as compared to the substrate support, thereby causing temperature non-uniformities proximate the edge of the substrate, thus causing an undesirable non-uniform processing of the substrate. In addition, the edge ring may be heated to a higher temperature than the substrate support during processing due to heat generated by the process or processing components, for example, such as an upper electrode (e.g., showerhead 114 or ceiling 142 described above), thereby leading to further temperature non-uniformities.

Accordingly, in some embodiments, the apparatus 105 for processing a substrate 110 may comprise a second ring 154 disposed between the first ring 150 and the substrate support 108 concentrically about the substrate support 108. By providing the second ring 154 a heat transfer path is provided between the substrate support 108 and the first ring 150. Providing the heat transfer path allows for a temperature of the first ring 150 to be controlled, thereby minimizing or eliminating the aforementioned temperature non-uniformities. For example, in embodiments where the substrate support 108 is actively cooled (e.g., via conduits disposed configured to circulate a heat transfer fluid) the substrate support 108 may function as a heat sink, thereby cooling the first ring 150 or offsetting any heating of the first ring 150 caused by heat generated by the process or processing components, as discussed above.

The second ring 154 may comprise any material suitable to facilitate the transfer of heat from the first ring 150 to the substrate support 108. For example, the second ring 154 may comprise an electrically insulating material having a high thermal conductivity and a high heat capacity, such as a ceramic, for example aluminum nitride (AlN). The electrically insulating material advantageously minimizes the impact that the second ring 154 has on the electromagnetic field generated near the substrate during processing.

In some embodiments, a layer 152 may be disposed between the first ring 150 and second ring 154 (and or between the second ring 154 and the substrate support 108)

to facilitate a more robust transfer of heat between the first ring 150 to the substrate support 108. The layer 152 may comprise any process-compatible material having a low thermal contact resistance, for example such as a silicone based material. The use of a thermally conductive thin compliant material for reduced thermal contact resistance between the parts of the cooling apparatus advantageously facilitates maximum heat transfer efficiency.

Figure 2:
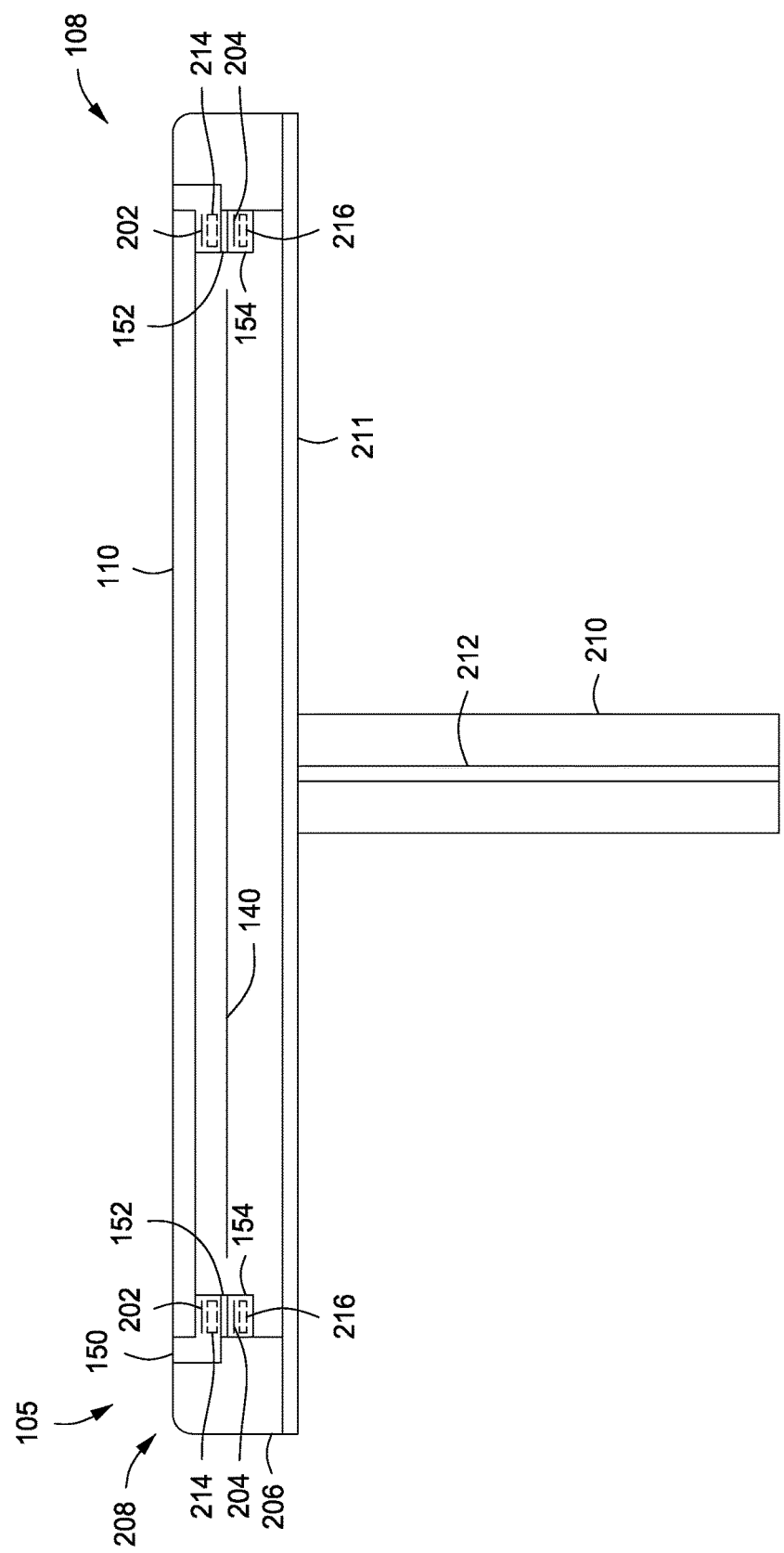
FIG. 2 depicts a vertical cross-sectional view of the substrate support in accordance with at least some embodiments of the invention.

In some embodiments, the apparatus 105 may be supported by a portion of a process kit ring 208, for example such as an inner ledge of a collar 206, such as shown in FIG. 2. In such embodiments, the process kit ring 208 may be supported by a plate 211 coupled to the pedestal support 210. In some embodiments, the pedestal support 210 may comprise one or more conduits (one conduit 212 shown) configured to provide process resources (e.g., RF or DC power, process gases, temperature control fluids, or the like) to the substrate support 108.

In some embodiments, to further facilitate control over the temperature of the first ring 150, the first ring 150 and/or second ring 154 may comprise one or more heat controlling mechanisms. For example, in some embodiments, the second ring 154 may comprise an embedded heater 204. The heater 204 may be any type of electrical heater suitable for semiconductor processing, for example, such as a resistive heater. In such embodiments, the first ring 150 may comprise one or more temperature sensors (one temperature sensor 202 shown) to monitor the temperature uniformity across the first ring 150. In operation, power is provided to the heater 204 to raise or lower the temperature of the heater 204 (and therefore the temperature of the second ring 154 and the first ring 150 via heat transfer) in accordance with a temperature measurement provided by the temperature sensor 202.

Figure 3:
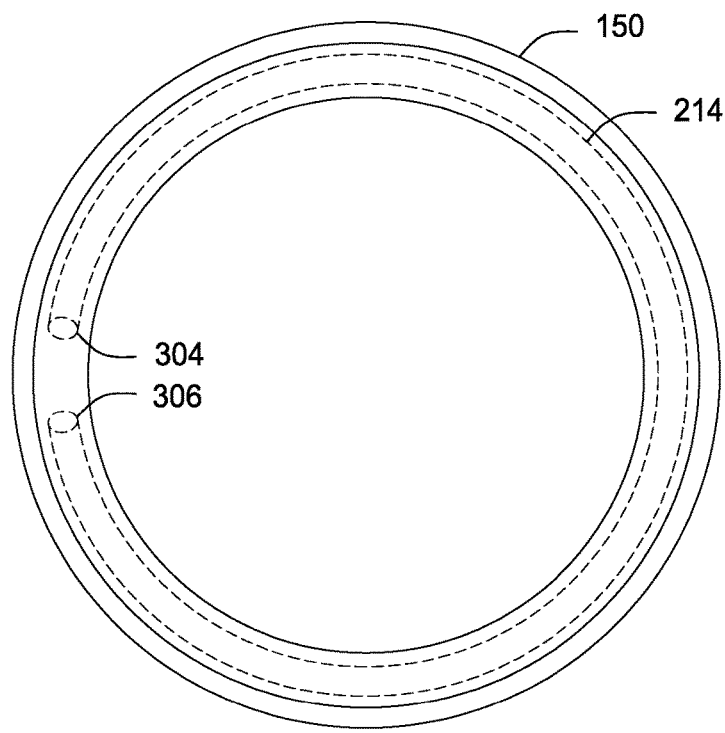
FIGS. 3-4 depict top views of portions of an apparatus for processing a substrate in accordance with some embodiments of the present invention.

Alternatively, or in combination, in some embodiments, to facilitate temperature control over the first ring 150, the first ring 150 may comprise one or more conduits (one conduit shown 214 in phantom) configured to allow a heat transfer fluid to flow through the first ring 150. The heat transfer fluid may be any type of fluid capable of maintaining temperature control properties during semiconductor processing, for example, a liquid such as water or a glycol containing coolant, or a gas, such as oxygen, helium, or the like. The heat transfer fluid may be provided to the conduit 214 from a supply (not shown) via, for example, the conduit 212 of the pedestal support 210. In some embodiments, an interface between the first ring 150 and the conduit 214 should be vacuum sealed to prevent any fluid leak to the process chamber. In some embodiments, the conduit 214 may comprise an inlet 304 and an outlet 306 to facilitate a flow of the heat transfer fluid through the conduit 214, such as shown in FIG. 3.

Referring back to FIG. 2, alternatively, or in combination, in some embodiments, to facilitate temperature control over the first ring 150, the second ring 154 may comprise one or more conduits (one conduit shown 216 in phantom) configured to flow a heat transfer fluid through the second ring 154.

Figure 4:
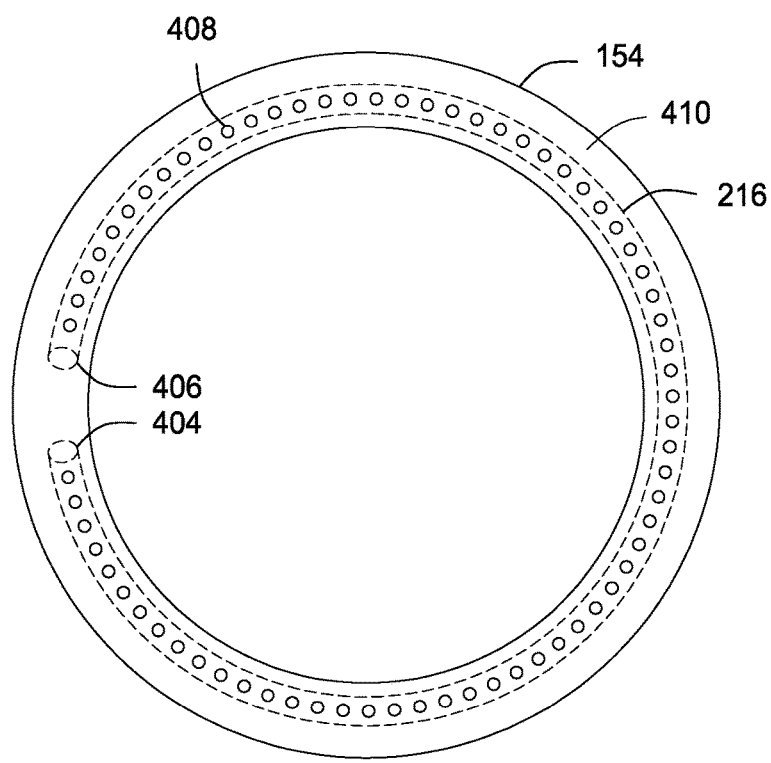

In some embodiments, the conduit 216 may comprise an inlet 404, an outlet 406 and a plurality of through holes 408 disposed through a top surface 410 of the second ring 154 and coupled to at least one of the one or more conduits (e.g., conduit 216), such as shown in FIG. 4. When present, the plurality of through holes 408 allow the heat transfer fluid to be provided to the back side of the first ring 150, thereby facilitating temperature control of the first ring 150. The heat transfer fluid may be any of the heat transfer fluids described above and may be provided to the conduit from a supply (not shown) via, for example, the conduit 212 of the pedestal support 210. In such embodiments, the heat transfer fluid to be used for thermal management should be inert, so as to minimize additional chemical reactions with the gases used for plasma processing inside the chamber.

Thus, an apparatus for processing a substrate that may advantageously be used as a cooling or heating apparatus, as needed, in various process chambers including but not limited to silicon etching, aluminum etching, and dielectric etching process chambers, has been provided herein. Embodiments of the present invention may advantageously provide a discrete, drop-in replacement part for a semiconductor processing chamber that allows for temperature control of an edge ring disposed in the processing chamber, thereby providing uniform heating and cooling of a substrate during processing. For example, embodiments of the present invention can be used to cool the edge ring in a plasma processing chamber, or to heat up the edge ring by reversing the heat flow direction from the substrate support to the first ring, or between the heat transfer fluid and the first ring.

While the foregoing is directed to embodiments of the present invention, other and further embodiments of the invention may be devised without departing from the basic scope thereof.

The invention claimed is:

1. An apparatus for processing a substrate, comprising:
a substrate support,
a first ring disposed concentrically about the substrate support, the first ring configured to position a substrate atop the substrate support during processing;
a second ring disposed between the substrate support and the first ring, the second ring configured to provide a heat transfer path from the first ring to the substrate support, wherein the second ring comprises a heater embedded within the second ring to control an amount of heat transfer between the first ring and the substrate support, wherein the first ring has an inner ledge, and wherein the second ring and the heater embedded in the second ring are entirely disposed below the inner ledge of the first ring;
a first thermally conductive layer disposed between the first ring and the second ring to facilitate a transfer of heat between the first ring to the substrate support, wherein the first thermally conductive layer covers the entire top surface of the second ring; and
a collar disposed entirely about an outer side surface of the first ring and entirely about an outer side surface of the second ring, wherein the collar has an inner ledge that at least partially supports the first ring.

2. The apparatus of claim 1, wherein the first ring comprises a temperature sensor embedded within the first ring.

3. The apparatus of claim 1, wherein the second ring comprises one or more conduits disposed within the second ring to flow a heat transfer fluid within the second ring.

4. The apparatus of claim 3, wherein the second ring further comprises a plurality of holes disposed through a surface of the second ring and coupled to at least one of the one or more conduits to provide the heat transfer fluid to the first thermally conductive layer.

5. The apparatus of claim 1, wherein the first ring comprises one or more conduits disposed within the first ring to flow a heat transfer fluid within the first ring.

6. The apparatus of claim 5, wherein an interface between the first ring and the one or more conduits are vacuum sealed to prevent any heat transfer fluid leakage.

7. The apparatus of claim 1, wherein the first thermally conductive layer is fabricated from a silicone containing material.

8. The apparatus of claim 1, wherein the second ring is fabricated from an electrically insulating material.

9. The apparatus of claim 1, further comprising:
a second thermally conductive layer disposed between the second ring and the substrate support to facilitate a transfer of heat between the first ring to the substrate support.

10. A process chamber comprising:
a chamber body defining an inner volume; and
a substrate support disposed within the inner volume, the substrate support having:
  a first ring disposed concentrically about a substrate support, the first ring configured to position a substrate atop the substrate support during processing,
  a second ring disposed between the substrate support and the first ring, the second ring configured to provide a heat transfer path from the first ring to the substrate support, wherein the second ring comprises a heater embedded within the second ring to control an amount of heat transfer between the first ring and the substrate support, wherein the first ring has an inner ledge, wherein the second ring and the heater embedded in the second ring are entirely disposed below the inner ledge of the first ring,
  a first thermally conductive layer disposed between the first ring and the second ring to facilitate a transfer of heat between the first ring to the substrate support, wherein the first thermally conductive layer covers the entire top surface of the second ring, and
  a collar disposed entirely about an outer side surface of the first ring and entirely about an outer side surface of the second ring, wherein the collar has an inner ledge that at least partially supports the first ring.

11. The process chamber of claim 10, wherein the first ring comprises a temperature sensor embedded within the first ring.

12. The process chamber of claim 10, wherein the second ring comprises one or more conduits disposed within the second ring to flow a heat transfer fluid within the second ring.

13. The process chamber of claim 12, wherein the second ring further comprises a plurality of holes disposed through a surface of the second ring and coupled to at least one conduit of the one or more conduits.

14. The process chamber of claim 10, wherein the first ring comprises one or more conduits disposed within the first ring to flow a heat transfer fluid within the first ring.

15. The process chamber of claim 14, wherein an interface between the first ring and the one or more conduits are vacuum sealed to prevent any heat transfer fluid leakage to the process chamber.

16. The process chamber of claim 10, wherein the first thermally conductive layer is fabricated from a silicone containing material.

17. The process chamber of claim 10, wherein the second ring is fabricated from an electrically insulating material.

18. The process chamber of claim 10, further comprising:
a second thermally conductive layer disposed between the second ring and the substrate support to facilitate a transfer of heat between the first ring to the substrate support.

* * * * *